United States Patent
Huang

(10) Patent No.: US 10,559,568 B1
(45) Date of Patent: Feb. 11, 2020

(54) METHOD FOR PREPARING SEMICONDUCTOR CAPACITOR STRUCTURE

(71) Applicant: NANYA TECHNOLOGY CORPORATION, New Taipei (TW)

(72) Inventor: Chung-Lin Huang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/126,258

(22) Filed: Sep. 10, 2018

(51) Int. Cl.
   H01L 21/00 (2006.01)
   H01L 27/00 (2006.01)
   H01L 27/108 (2006.01)
   H01L 49/02 (2006.01)
   H01L 21/84 (2006.01)

(52) U.S. Cl.
   CPC ........ H01L 27/10817 (2013.01); H01L 21/84 (2013.01); H01L 27/10852 (2013.01); H01L 28/92 (2013.01)

(58) Field of Classification Search
   CPC ......... H01L 27/10817; H01L 27/10852; H01L 27/14636; H01L 28/92; H01L 21/84; H01L 21/022; H01L 21/02244; H01L 21/31683; H01L 28/60; H01L 28/87; H01L 28/75; H01L 28/91
   See application file for complete search history.

(56) References Cited

U.S. PATENT DOCUMENTS

| | | | | |
|---|---|---|---|---|
| 6,855,222 B2* | 2/2005 | Konoue | ................. | B32B 18/00 |
| | | | | 156/89.16 |
| 8,233,265 B2* | 7/2012 | Otsuka | ..................... | H01G 2/06 |
| | | | | 361/306.3 |
| 2004/0084131 A1* | 5/2004 | Konoue | ................. | B32B 18/00 |
| | | | | 156/89.11 |
| 2010/0123995 A1* | 5/2010 | Otsuka | ..................... | H01G 2/06 |
| | | | | 361/308.1 |

FOREIGN PATENT DOCUMENTS

TW          201316385 A        4/2013

* cited by examiner

*Primary Examiner* — Nikolay K Yushin
(74) *Attorney, Agent, or Firm* — Muncy, Geissler, Olds & Lowe, P.C.

(57) ABSTRACT

The present disclosure provides a semiconductor capacitor structure. The semiconductor capacitor structure includes a substrate, a comb-like bottom electrode disposed over the substrate, a top electrode disposed over the comb-like bottom electrode, and a dielectric layer sandwiched between the top electrode and the comb-like bottom electrode. The comb-like bottom electrode includes a plurality of tooth portions parallel to the substrate and a supporting portion coupled to the plurality of tooth portions and perpendicular to the substrate.

11 Claims, 14 Drawing Sheets

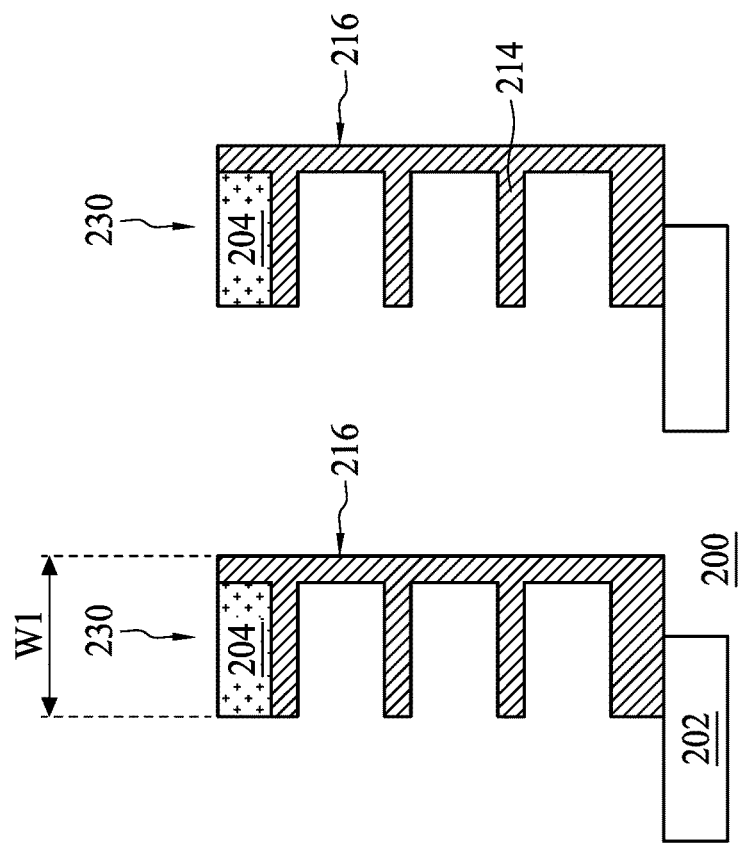
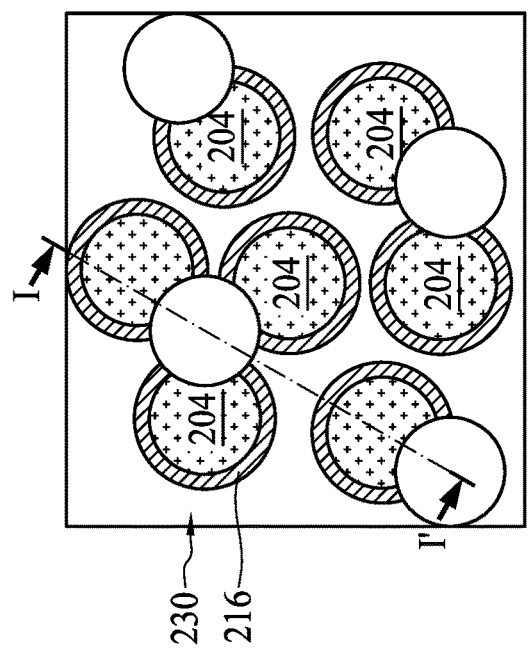
FIG. 7A
FIG. 7B

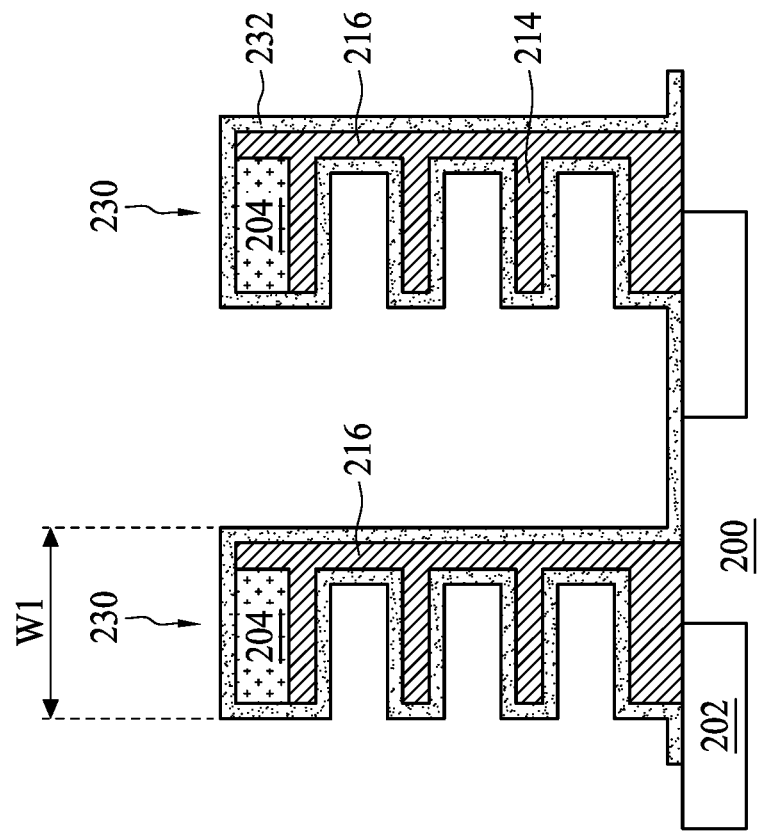
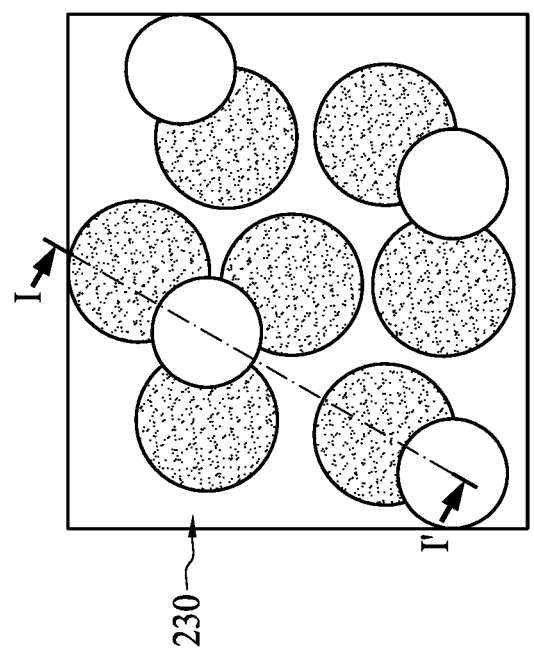
FIG. 8B
FIG. 8A

METHOD FOR PREPARING SEMICONDUCTOR CAPACITOR STRUCTURE

TECHNICAL FIELD

The present disclosure relates to a semiconductor capacitor structure and a method for preparing the same, and more particularly, to a semiconductor capacitor structure in a DRAM cell and a method for preparing the same.

DISCUSSION OF THE BACKGROUND

A DRAM cell structure typically includes a metal-oxide-semiconductor field effect transistor (MOSFET) device and a capacitor that are built in or on a semiconductor silicon substrate. The MOSFET device and the capacitor form a series connection with each other. Using a word line and a bit line, a DRAM cell structure can be read and programmed.

There is a continuing trend of increasing the storage density of integrated circuit memories to provide increased quantities of data storage on a single chip. To address the challenges of reduced structure sizes, DRAM designs have been proposed to incorporate capacitors having vertical extensions above the surface of the substrate ("stacked" capacitors) or below the surface of the substrate ("trenched" capacitors). By adopting a more three-dimensional structure, such DRAM designs provide memory capacitors having larger capacitance while occupying less surface area of the substrate.

However, when the critical dimension of a DRAM cell structure is reduced to sub-20 nm scale, the occupied area is too small to allow formation of a capacitor with a very tall, vertical cylinder shape formed by current photolithography and etching processes. Therefore, there is a need for a method of preparing a capacitor having high capacitance in a DRAM cell structure.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor capacitor structure. The semiconductor capacitor structure includes a substrate, a comb-like bottom electrode disposed over the substrate, a top electrode disposed over the comb-like bottom electrode, and a dielectric layer sandwiched between the top electrode and the comb-like bottom electrode. In some embodiments, the comb-like bottom electrode includes a plurality of tooth portions parallel to the substrate and a supporting portion coupled to the plurality of tooth portions and perpendicular to the substrate.

In some embodiments, distances between adjacent pairs of tooth portions are the same.

In some embodiments, the dielectric layer is in entirely contact with a surface of the comb-like bottom electrode.

In some embodiments, the plurality of tooth portions include a lowest tooth, and a thickness of the lowest tooth is greater than a thickness of the other tooth portions.

In some embodiments, the thickness of the other tooth portions is between approximately 1 nm and approximately 100 nm.

In some embodiments, the plurality of tooth portions include a topmost tooth, and an insulating layer is disposed on the topmost tooth.

In some embodiments, the dielectric layer is separated from a top surface of the topmost tooth by the insulating layer.

In some embodiments, the semiconductor capacitor structure further includes a landing pad. In some embodiments, the comb-like bottom electrode is disposed on the landing pad, and electrically connected to the landing pad.

In some embodiments, the landing pad and the comb-like bottom electrode include different materials.

Another aspect of the present disclosure provides a method for preparing a semiconductor capacitor structure. The method includes the following steps. A multi-layer structure is provided. In some embodiments, the multi-layer structure includes a plurality of first insulating layers and a plurality of conductive layers. In some embodiments, the first insulating layers and the conductive layers are alternately arranged. The multi-layer structure is patterned to form a plurality of columns. In some embodiments, the plurality of columns are separated from each other by a plurality of first trenches. A supporting layer is formed on sidewalls of each of the plurality of columns. The plurality of first trenches is filled with a second insulating layer. Portions of the second insulating layer and a portion of the supporting layer are removed to form a plurality of second trenches. In some embodiments, the plurality of second trenches expose the plurality of first insulating layers and the plurality of conductive layers. The plurality of first insulating layers and the second insulating layer are removed to form a plurality of comb-like bottom electrodes. A dielectric layer is formed to cover the plurality of comb-like bottom electrodes. A plurality of top electrodes are formed on the dielectric layer.

In some embodiments, two of the plurality of conductive layers form a top and a bottom of the multi-layer structure.

In some embodiments, a thickness of the plurality of first insulating layers is greater than a thickness of the plurality of conductive layers.

In some embodiments, the forming of the plurality of columns further includes the following steps. A patterned hard mask is formed on the multi-layer structure. Portions of the multi-layer structure are removed through the patterned hard mask.

In some embodiments, the dielectric layer covers a top surface of the patterned hard mask.

In some embodiments, the patterned hard mask is removed after the forming of the plurality of second trenches.

In some embodiments, a width of the plurality of first trenches is between approximately 5 nm and approximately 200 nm.

In some embodiments, a width of the plurality of second trenches is less than the width of the plurality of first trenches.

In some embodiments, a width of the plurality of columns is between approximately 5 nm and approximately 200 nm.

In some embodiments, portions of sidewalls of each of the plurality of second trenches are formed by the second insulating layer, and other portions of each of the plurality of second trenches are formed by the plurality of conductive layers and the plurality of first insulating layers.

In some embodiments, each of the plurality of comb-like structures includes the plurality of conductive layers and a portion of the supporting layer coupled to the plurality of conductive layers.

In the present disclosure, the comb-like bottom electrode is provided. It is widely known that capacitance is a function only of the geometry of the design (e.g. surface area of the electrodes and the distance between them) and the permittivity of the dielectric material between the electrodes of the capacitor. The comb-like configuration increases surface area of the electrodes. The capacitance of the semiconductor capacitor structure provided by the present disclosure is therefore increased without increasing area occupied by the capacitor structure due to the comb-like configuration.

In contrast, with a comparative method applied without forming the comb-like bottom electrode, complicated photolithography and etching processes are required to form a thinner and taller electrode in order to increase the surface area. Further, it is observed that such thin, tall bottom electrode may collapse. Accordingly, the conventional processes for forming DRAM cell structures are not only complicated, but also provide reduced yield and reliability.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

FIGS. 2A, 3A, 4A, 5A, 6A, 7A, 8A and 9A are schematic diagrams illustrating various fabrication stages of the method for preparing the semiconductor capacitor structure in accordance with the first embodiment of the present disclosure.

FIGS. 2B, 3B, 4B, 5B, 6B, 7B, 8B and 9B are cross-sectional views taken along line I-I' in FIGS. 2A, 3A, 4A, 5A, 6A, 7A, 8A and 9A, respectively.

DETAILED DESCRIPTION

Figure 1:
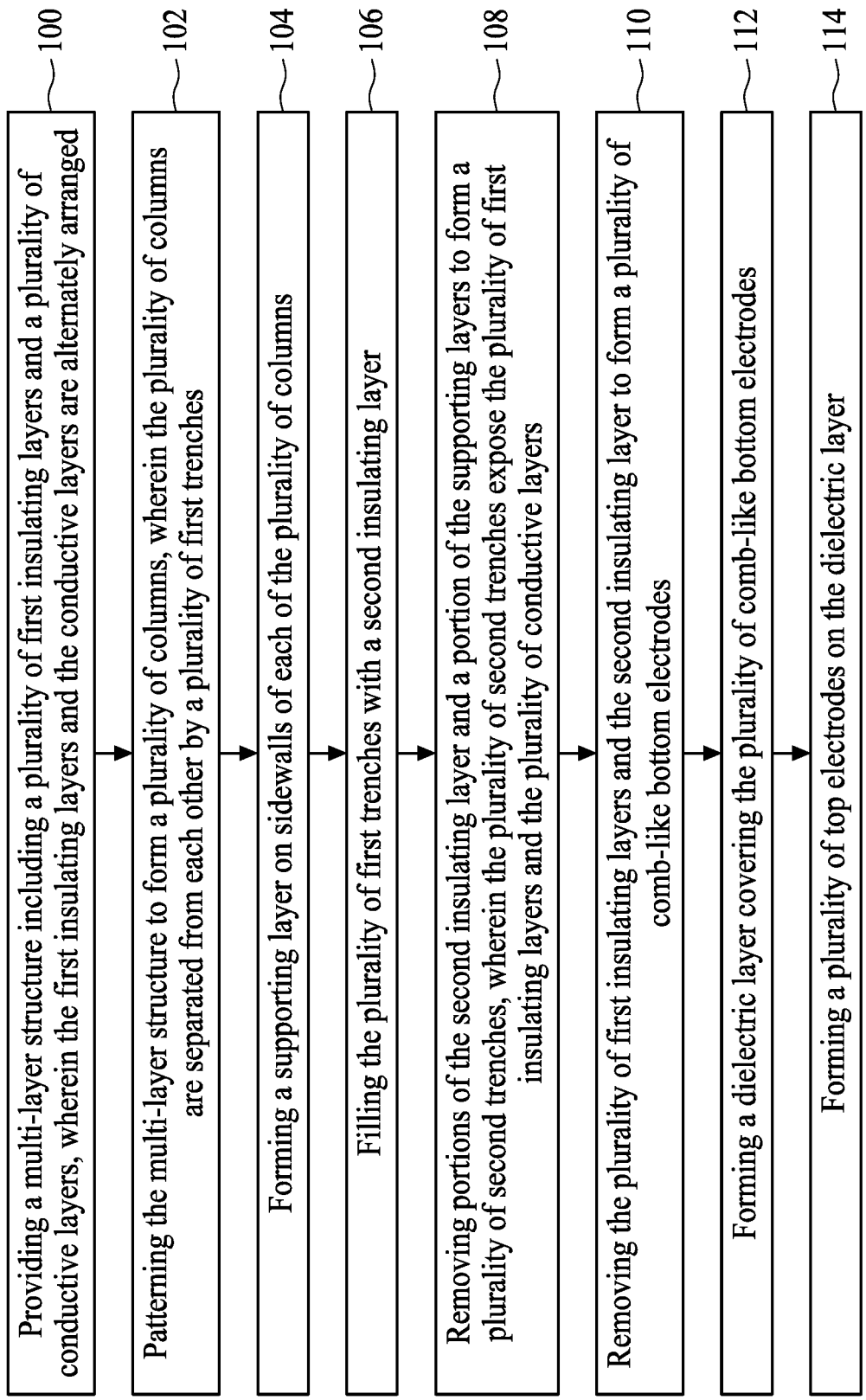
FIG. 1 is a flow diagram illustrating a method for preparing a semiconductor capacitor structure, in accordance with a first embodiment of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a fast element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

As used herein, the terms "patterning" or "patterned" are used in the present disclosure to describe an operation of forming a predetermined pattern on a surface. The patterning operation includes various steps and processes and varies in accordance with different embodiments. In some embodiments, a patterning process is adopted to pattern an existing film or layer. The patterning process includes forming a mask on the existing film or layer and removing the unmasked film or layer with an etch or other removal process. The mask can be a photoresist or a hard mask. In some embodiments, a patterning process is adopted to form a patterned layer directly on a surface. The patterning process includes forming a photosensitive film on the surface, conducting a photolithography process, and performing a developing process. The remaining photosensitive film is retained and integrated into the semiconductor device.

FIG. 1 is a flow diagram illustrating a method for preparing a semiconductor capacitor structure in accordance with a first embodiment of the present disclosure. The method for preparing the semiconductor capacitor structure 10 includes a step 100, providing a multi-layer structure including a plurality of first insulating layers and a plurality of conductive layers. According to the first embodiment, the first insulating layers and the conductive layers are alternately arranged. The method for preparing the semiconductor capacitor structure 10 further includes a step 102, patterning the multi-layer structure to form a plurality of columns. In the first embodiment, the plurality of columns are separated from each other by a plurality of first trenches. The method for preparing the semiconductor capacitor structure 10 further includes a step 104, forming a supporting layer on sidewalls of each of the plurality of columns. The method for preparing the semiconductor capacitor structure 10 further includes a step 106, filling the plurality of first trenches with a second insulating layer. The method for preparing the semiconductor capacitor structure 10 further includes a step 108, removing portions of the second insulating layer and a portion of the supporting layers to form a plurality of second trenches. In the first embodiment, the plurality of second trenches expose the plurality of first insulating layers and the plurality of first conductive layers. The method for preparing the semiconductor capacitor structure 10 further includes a step 110, removing the plurality of first insulating layers and the second insulating layer to form a plurality of comb-like bottom electrodes. The method for preparing the semiconductor capacitor structure 10 further includes a step 112, forming a dielectric layer to cover the plurality of comb-like bottom electrodes. The method for preparing the semiconductor capacitor structure 10 further includes a step 114, forming a plurality of top electrodes on the dielectric layer. The method for preparing the semiconductor capacitor structure 10 will be further described according to the first embodiment.

Figure 2B:
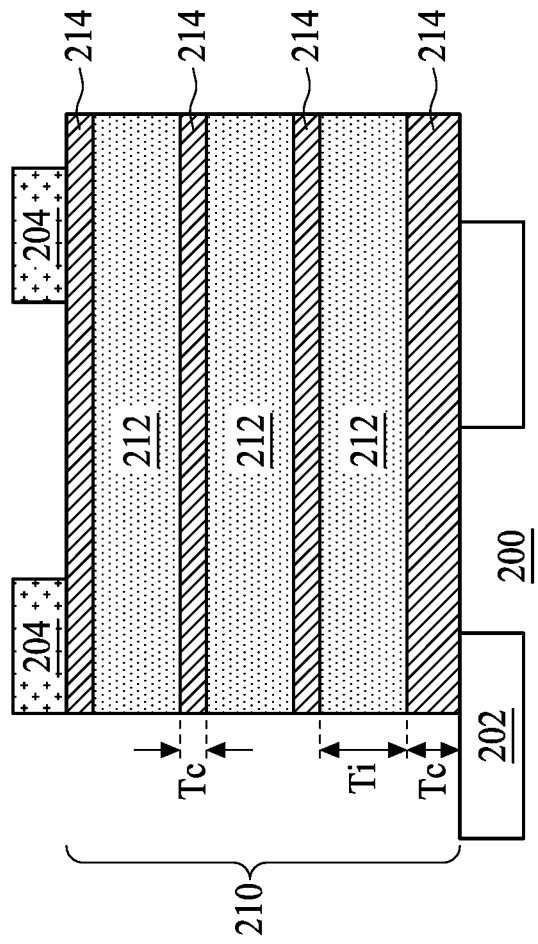
Figure 2A:
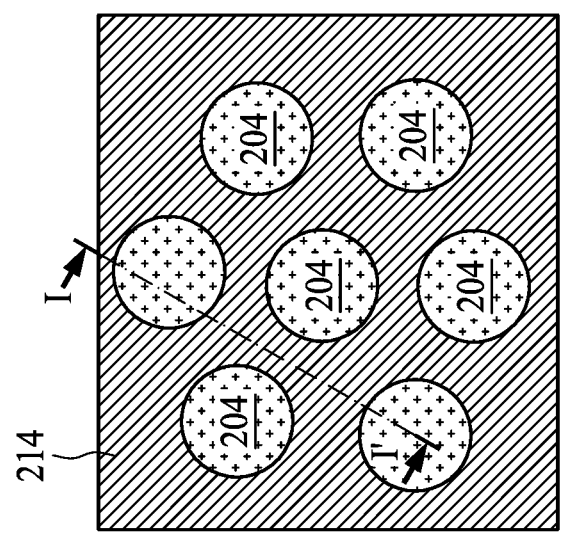

FIGS. 2A, 3A, 4A, 5A, 6A, 7A, 8A, and 9A are schematic diagrams illustrating various fabrication stages constructed according to the method for preparing the semiconductor capacitor structure in accordance with the first embodiment of the present disclosure, and FIGS. 2B, 3B, 4B, 5B, 6B, 7B, 8B and 9B are cross-sectional views taken along line I-I' in FIGS. 2A, 3A, 4A, 5A, 6A, 7A, 8A and 9A, respectively. Referring to FIGS. 2A and 2B, a substrate 200 can be provided. The substrate 200 can include silicon (Si), gallium (Ga), gallium arsenide (GaAs), gallium nitride (GaN), strained silicon, silicon-germanium (SiGe), silicon carbide (SiC), diamond, epitaxy layer or a combination thereof, but the disclosure is not limited thereto. A well region (not shown) may be formed in the substrate 200. The well region may be neutral, or may be an n-type or p-type doped region, depending on the conductivity type of the transistor structure to be formed thereafter. An isolation structure (not shown), such as a shallow trench isolation (hereinafter abbreviated as STI) structure, is formed in the substrate 200 for defining at least an active region (not shown).

Still referring to FIG. 2A, at least a gate structure (not shown) is disposed in the substrate 200 in the active region. In some embodiments, the gate structure can be a buried gate structure, but the disclosure is not limited thereto. A first source/drain region and a second source/drain region (not shown) are formed in the active region at two opposite sides of the gate structure. A bit line structure (not shown) can be formed over the first source/drain region. In some embodiments, the bit line structure and the first source/drain region are electrically connected by a contact plug (not shown). A landing pad 202 can be formed over the second source/drain region and electrically connected to the second source/drain region by a contact plug (not shown).

Referring to FIGS. 2A and 2B, a multi-layer structure 210 is provided, according to step 100. In some embodiments, the multi-layer structure 210 is formed over the substrate 200. The multi-layer structure 210 includes a plurality of insulating layers 212 and a plurality of conductive layers 214. In some embodiments, a patterned hard mask 204 can be formed on the multi-layer structure 210. The patterned hard mask 204 can include insulating materials. As shown in FIG. 2B, the insulating layers 212 and the conductive layers 214 are alternately arranged. According to the first embodiments, two of the plurality of conductive layers 214 form a top and a bottom of the multi-layer structure 210. The patterned hard mask 204 is therefore in contact with the conductive layer 214 serving as the top of the multi-layer structure 210. In some embodiments, a thickness Tc' of the conductive layer 214 serving as the bottom of the multi-layer structure 210 is greater than a thickness Tc of other conductive layers 214, but the disclosure is not limited thereto. Further, the conductive layer 214 serving as the bottom of the multi-layer structure 210 is in contact with the landing pads 202.

The plurality of insulating layers 212 can include silicon oxide (SiO), silicon nitride (SiN), silicon oxynitride (SiON), boro-phospho-silicate glass (BPSG), phosphosilicate (PSG), borosilicate (BSG), or the like, but the disclosure is not limited thereto. The plurality of conductive layer 214 can include titanium nitride (TiN), titanium (Ti), tungsten nitride (WN), tungsten (W), tantalum (Ta), doped polysilicon (i.e., N-doped polysilicon or P-doped polysilicon), carbon (C), cobalt (Co), or the like, but the disclosure is not limited thereto. A thickness Ti of the plurality of insulating layers 212 is greater than the thickness Tc of the plurality of conductive layers 214. In some embodiments, a ratio of the thickness Ti of the plurality of insulating layers 212 and the thickness Tc of the plurality of conductive layers 214 is between 1 and 10, but the disclosure is not limited thereto. In some embodiments, the thickness Ti of the plurality of insulating layers 212 is between approximately 10 nm and approximately 100 nm, but the disclosure is not limited thereto. In some embodiments, the thickness Tc of the plurality of conductive layers 214 is between approximately 1 nm and approximately 10 nm, but the disclosure is not limited thereto.

Figure 3B:
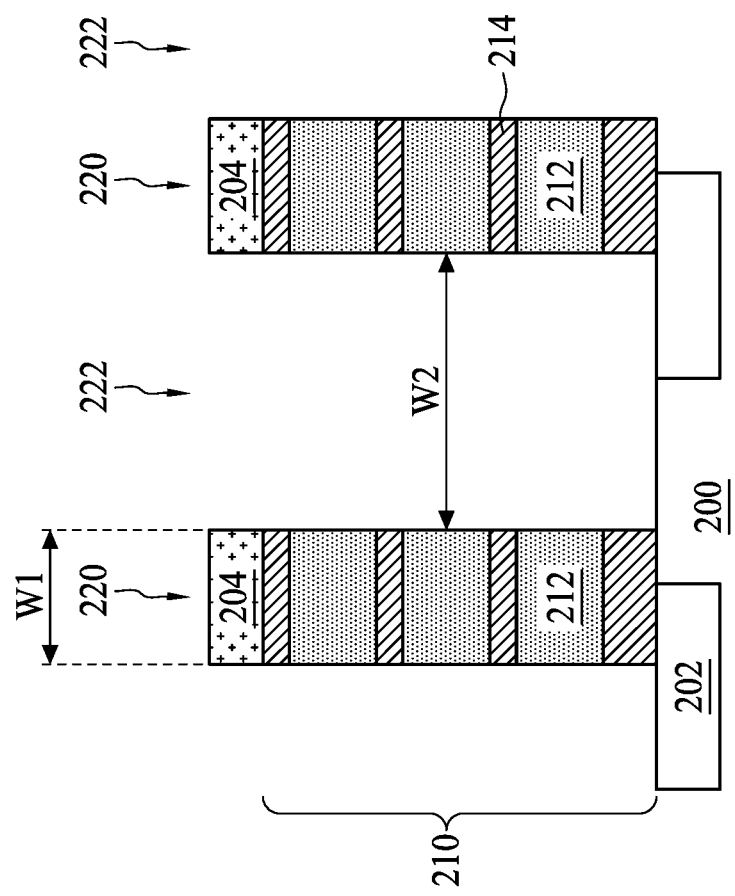
Figure 3A:
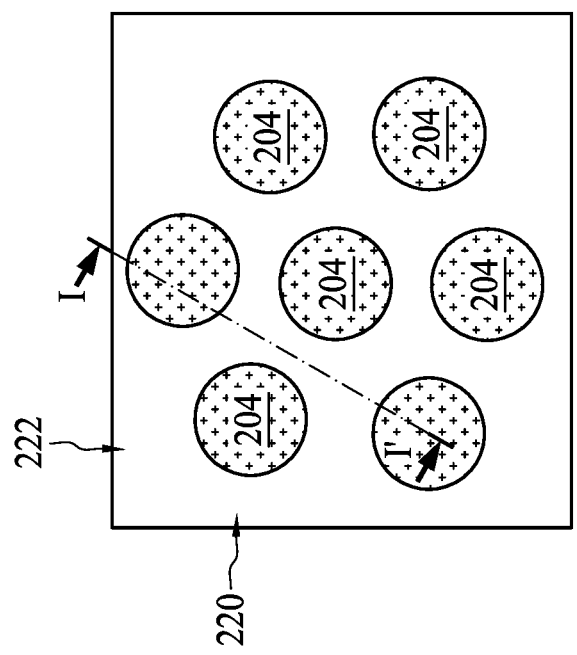

Referring to FIGS. 3A and 3B, the multi-layer structure 210 is patterned to form a plurality of columns 220, according to step 102. In some embodiments, portions of the multi-layer structure 210 are removed through the patterned hard mask 204, and thus the plurality of columns 220 are formed over the substrate 200. As shown in FIGS. 3A and 3B, the plurality of columns 220 are separated from each other by a plurality of first trenches 222. Further, the plurality of first trenches 222 are coupled to each other, as shown in FIG. 3A. In some embodiments, a width W1 of the plurality of columns 220 is between approximately 5 nm and approximately 200 nm, but the disclosure is not limited thereto. In some embodiments, the width W1 of the plurality of columns 220 can be equal to the diameter of the plurality of columns 220. In some embodiments, a width W2 of the plurality of first trenches 222 is between approximately 5 nm and approximately 200 nm, but the disclosure is not limited thereto. In some embodiments, each of the plurality of columns 220 is formed on one of the landing pads 202. In some embodiments, each of the plurality of columns 220 partially overlaps one of the landing pads 202, as shown in FIG. 3B, but the disclosure is not limited thereto.

Figure 4B:
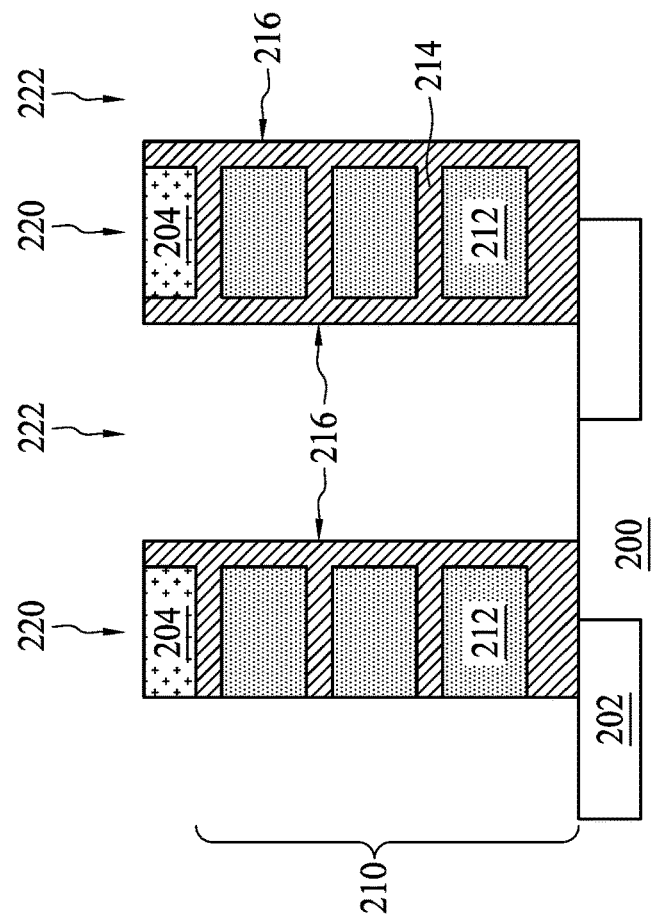
Figure 4A:
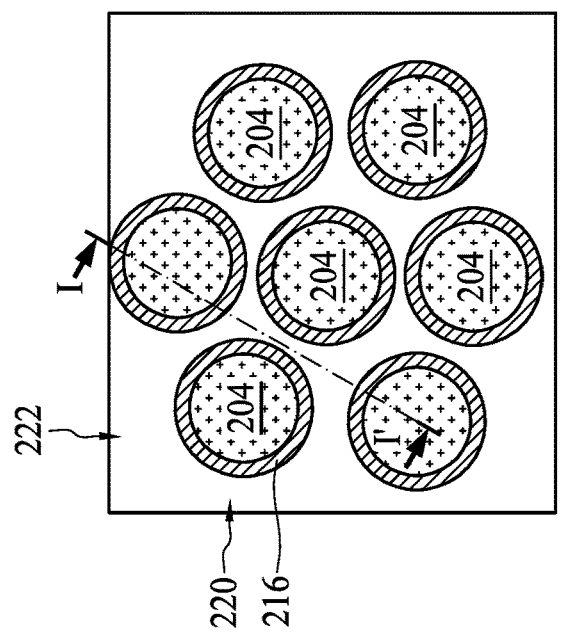

Referring to FIGS. 4A and 4B, a conductive layer is formed over the substrate 200, and an etching back is performed to remove portions of the conductive layer. Consequently, a supporting layer 216 is formed on sidewalls of each of the plurality of columns 220, according to step 104. The supporting layer 216 includes materials that are the same as those included in the plurality of conductive layers 214. In some embodiments, a thickness of the supporting layer 216 can be the same as the thickness of the plurality of conductive layers 214, but the disclosure is not limited thereto. As shown in FIG. 4B, the supporting layer 216 is in contact with the plurality of conductive layers 214. In some embodiments, the plurality of first insulating layers 212 are effectively sealed within the plurality of conductive layers 214 and the supporting layer 216.

Figure 5B:
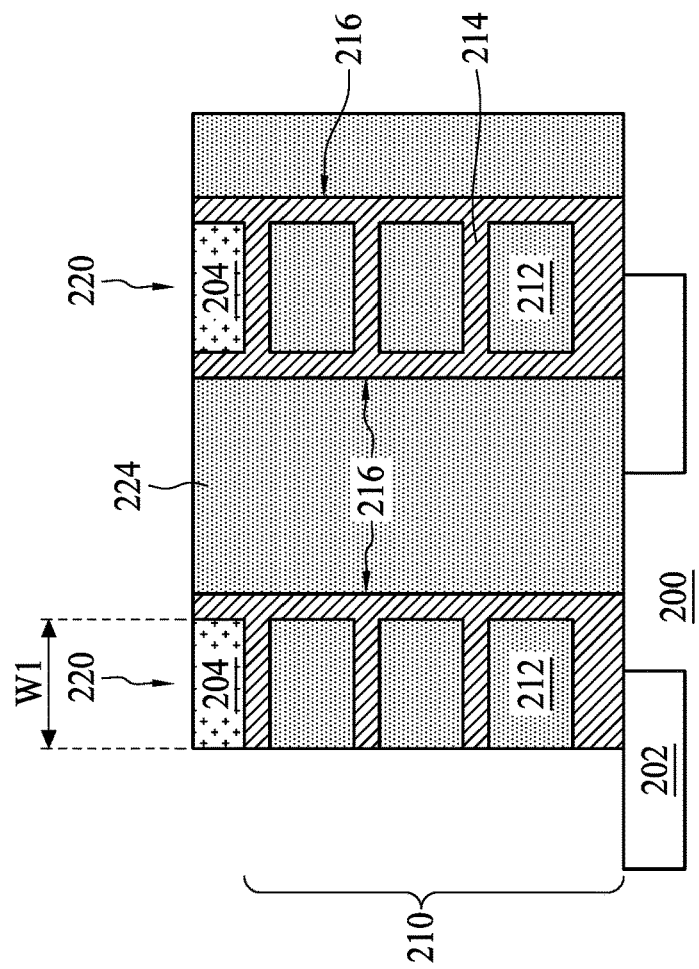
Figure 5A:
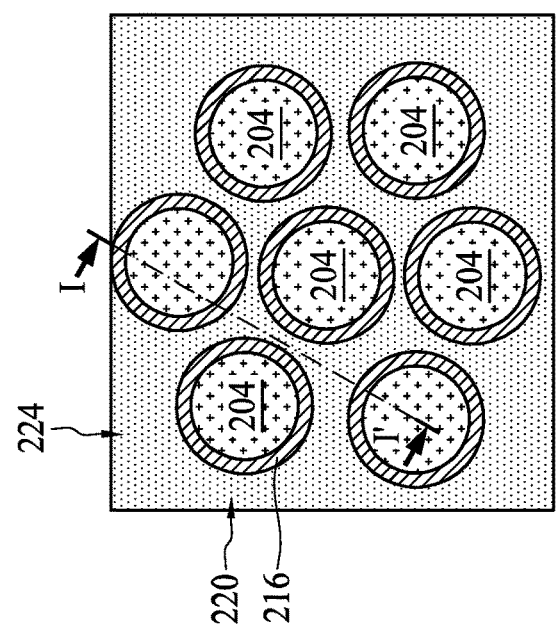

Referring to FIGS. 5A and 5B, a second insulating layer 224 is formed to fill the plurality of first trenches 222 according to step 106. In some embodiments, a planarization can be performed such that a top surface of the second insulating layer 224 is substantially coplanar with a top surface of the patterned hard mask 204. In some embodiments, the second insulating layer 224 can include materials that are the same as those included in the plurality of first insulating layers 212.

Figure 6B:
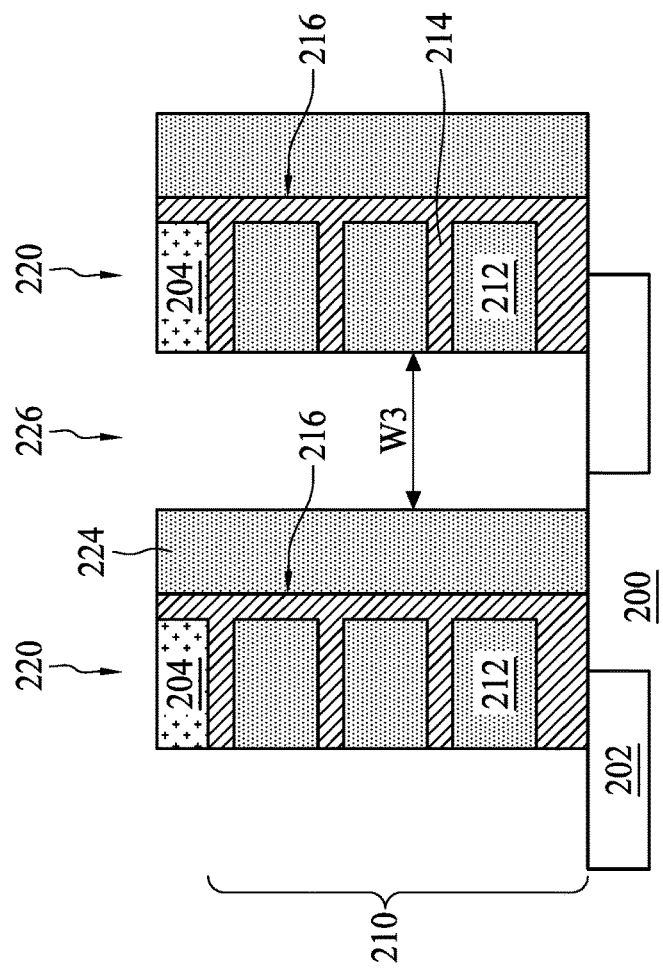
Figure 6A:
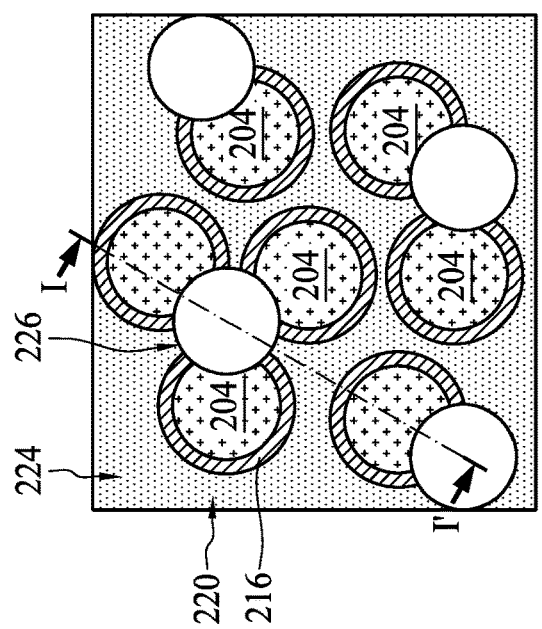

Referring to FIGS. 6A and 6B, portions of the second insulating layer 224 and a portion of the supporting layer 216 are removed to form a plurality of second trenches 226 on the substrate 200, according to step 108. In some embodiments, a portion of each of the plurality of columns 220 (i.e., the plurality of first insulating layers 212 and the plurality of conductive layers 214) is removed in step 108. In some embodiments, each of the plurality of second trenches 226 exposes the plurality of first insulating layers 212 and the plurality of conductive layers 214 of each column 220. Each second trench 226 is formed partially within at least one of the plurality of columns 210. As shown in FIG. 6A, each second trench 226 can be formed to be partially within one column 220, the second trench 226 can be formed to be partially within two columns 220, or the second trench 226 can be formed to be partially within three columns 220. In other embodiments, the second trench 226 can be formed to be partially within four or more columns 226, depending on the process or product requirements. Each of the columns 220 has a side exposed through one second trench 226, as shown in FIG. 6A. Specifically, the plurality of first insulating layers 212 and the plurality of conductive layers 214 are exposed through the second trench 226, as well as through the second insulating layer 224. In other words, portions of sidewalls of each of the plurality of second trenches 226 are formed by the second insulating layer 224, and other portions of each of the plurality of second trenches 226 are formed by the plurality of conductive layers 214 and the plurality of first insulating layers 212. In some embodiments, a width W3 of the plurality of second trenches 226 is less than the width W2 of the plurality of first trenches 222, but the disclosure is not limited thereto.

Referring to FIGS. 7A and 7B, the plurality of first insulating layers 212 and the second insulating layer 224 exposed through each of the plurality of second trenches 226 are entirely removed, and consequently a plurality of comb-like bottom electrodes 230 are formed, according to step 110. In other words, the plurality of columns 220 are transformed to be the plurality of comb-like bottom electrodes 230. As shown in FIG. 7B, each of the plurality of comb-like structures 230 includes the plurality conductive layers 214, and a portion of the supporting layer 216 coupled to the plurality of conductive layers 214.

Referring to FIGS. 8A and 8B, a dielectric layer 232 is formed to cover the plurality of comb-like bottom electrodes 230 according to step 112. In some embodiments, a thickness of the dielectric layer 232 is between approximately 3 nm and approximately 30 nm, but the disclosure is not limited thereto. In some embodiments, the dielectric layer 232 can include oxide/silicon nitride/oxide (ONO) or high-k dielectric material such as $Ta_2O_5$, but the disclosure is not limited thereto. As shown in FIG. 8B, the dielectric layer 232 covers exposed surfaces of the plurality of conductive layers 214 and the supporting layer 216 of each comb-like bottom electrode 230. In some embodiments, the dielectric layer 232 covers a top surface of the patterned hard mask 204. In some embodiments, the dielectric layer 232 covers the landing pads 202.

Figure 9A:
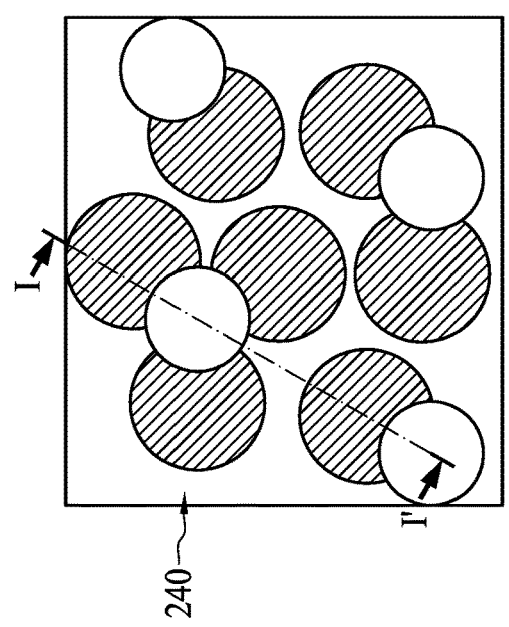
Figure 9B:
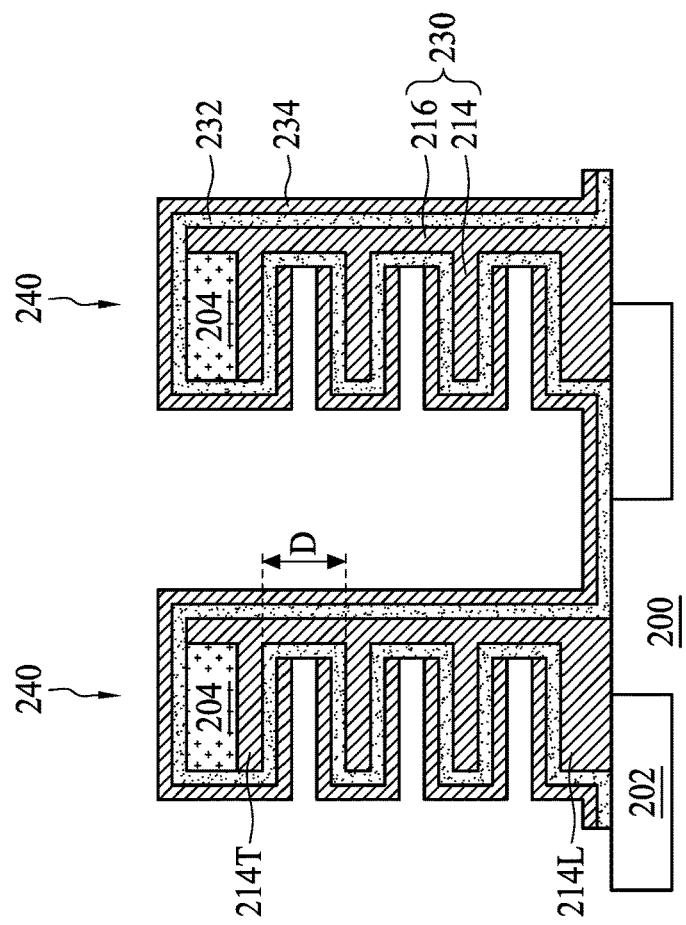

Referring to FIGS. 9A and 9B, a plurality of top electrodes 234 are formed on the dielectric layer 232 according to step 114. In some embodiments, the plurality of top electrodes 234 can include materials that are the same as those included in the comb-like bottom electrodes 230, but the disclosure is not limited thereto. In some embodiments, a thickness of the plurality of top electrodes 234 can be the same as the thickness of the comb-like bottom electrodes 230 (i.e., the plurality of conductive layers 214 and the supporting layer 216). In alternative embodiments, a thickness of the plurality of top electrodes 234 can be different from the thickness of the comb-like bottom electrodes 230. Each of the plurality of top electrodes 234 is separated from each of the plurality of comb-like bottom electrodes 230 by the dielectric layer 232. Further, the top electrodes 234 are further separated from the topmost conductive layer 214 by the patterned hard mask 204, as shown in FIG. 9B.

Accordingly, a semiconductor capacitor structure 240 is provided. As shown in FIGS. 9A and 9B, the semiconductor capacitor structure 240 includes the substrate 200, the comb-like bottom electrode 230 disposed over the substrate 200, the top electrode 234 disposed over the comb-like bottom electrode 230, and the dielectric layer 232 sandwiched between the top electrode 234 and the comb-like bottom electrode 230. As shown in FIG. 9B, the comb-like bottom electrode 230 includes a plurality of tooth portions 214, which are formed by the plurality of conductive layers 214, and a supporting portion 216, which is formed by the supporting layer 216. As shown in FIG. 9B, the plurality of tooth portions 214 extend along a direction parallel to a surface of the substrate 200, while the supporting portion 216 extends along a direction perpendicular to the surface of the substrate 200. In other words, the plurality of tooth portions 214 are parallel to the substrate 200 while the supporting portion 216 is perpendicular to the substrate 200.

Each of the tooth portions 214 of the comb-like bottom electrode 230 is separated from the other tooth portions 214 by a distance D. In some embodiments, the distances D between adjacent pairs of tooth portions 214 are the same, but the disclosure is not limited thereto. In some embodiments, the plurality of tooth portions 214 includes a topmost tooth 214T, and the patterned hard mask (e.g., an insulating layer) 204 is disposed on the topmost tooth 214T. Therefore, the dielectric layer 232 is separated from a top surface of the topmost tooth 214T by the insulating layer 204. In some embodiments, the plurality of tooth portions 214 includes a lowest tooth 214L, and a thickness of the lowest tooth 214L is greater than a thickness of the other tooth portions 214, but the disclosure is not limited thereto. In some embodiments, the comb-like bottom electrode 230 is disposed on the landing pad 202, and the lowest tooth 214L is electrically connected to the landing pad 202, which is electrically connected to the second source/drain region of the transistor device of the DRAM cell. In some embodiments, the landing pad 202 and the comb-like bottom electrode 230 can include different materials. In alternative embodiments, the landing pad 202 and the comb-like bottom electrode 230 can include the same materials. In some embodiments, the lowest tooth 214L can serve as a landing pad, which is electrically connected to the second source/drain region of the transistor device of the DRAM cell.

Still referring to FIGS. 9A and 9B, capacitance is a function only of the geometry of the design (e.g. surface area of the electrodes 230 and 234, and the distance between them) and the permittivity of the dielectric layer 232 between the electrodes 230 and 234 of the semiconductor capacitor structure 240. The comb-like configuration of the bottom electrode 230 helps to increase surface area of the two electrodes 230 and 234. The capacitance of the semiconductor capacitor structure 240 provided by the present disclosure is therefore increased due to the comb-like configuration.

Figure 10:
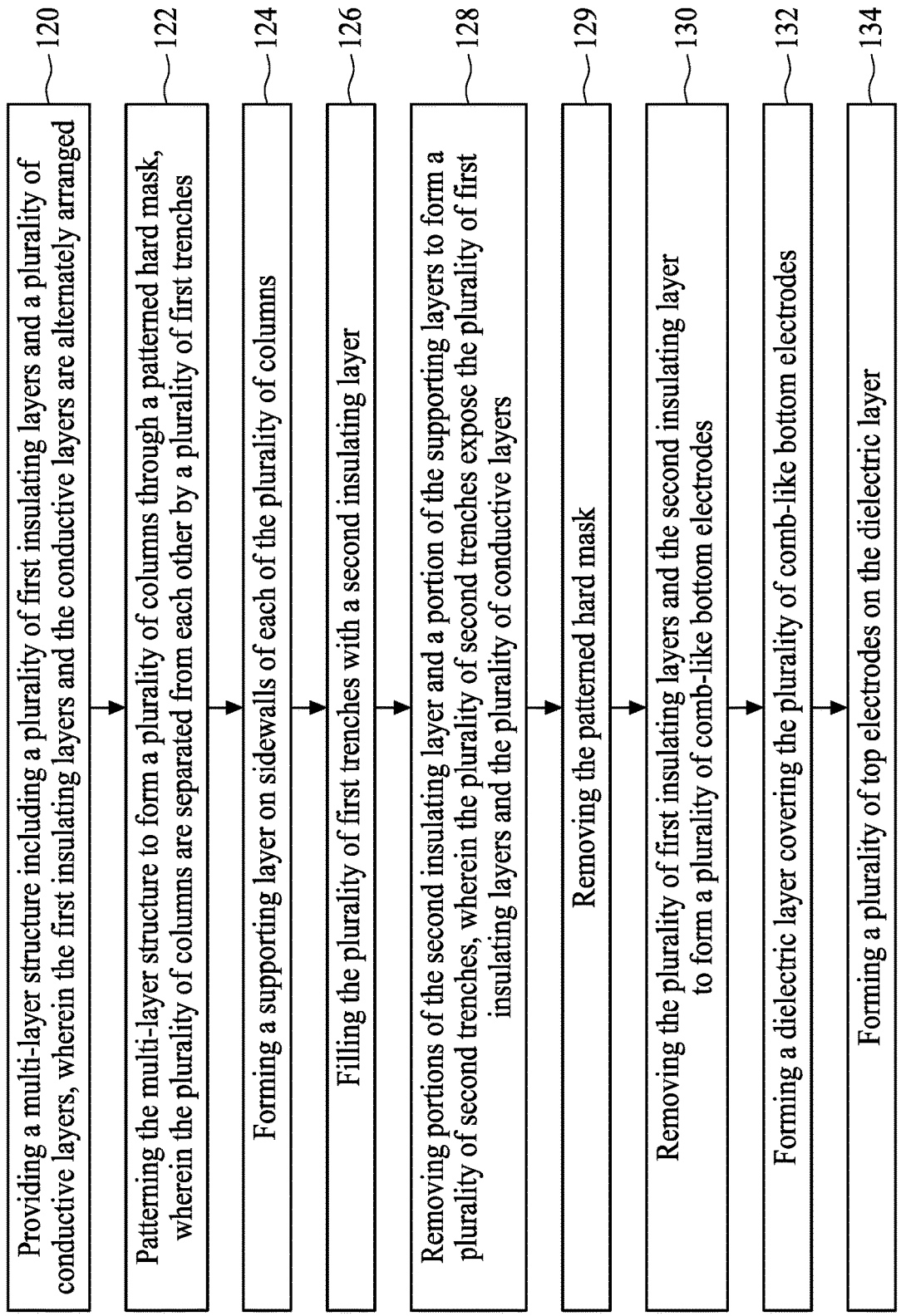
FIG. 10 is a flow diagram illustrating a method for preparing a semiconductor structure, in accordance with a second embodiment of the present disclosure.

FIG. 10 is a flow diagram illustrating a method for preparing a semiconductor capacitor structure 12 in accordance with a second embodiment of the present disclosure. The method for preparing the semiconductor capacitor structure 12 includes a step 120, providing a multi-layer structure including a plurality of first insulating layers and a plurality of conductive layers. According to the second embodiment, the first insulating layers and the conductive layers are alternately arranged. The method for preparing the semiconductor capacitor structure 12 further includes a step 122, patterning the multi-layer structure to form a plurality of columns through a patterned hard mask. In the second embodiment, the plurality of columns are separated from each other by a plurality of first trenches. The method for preparing the semiconductor capacitor structure 12 further includes a step 124, forming a supporting layer on sidewalls of each of the plurality of columns. The method for preparing the semiconductor capacitor structure 12 further includes a step 126, filling the plurality of first trenches with a second insulating layer. The method for preparing the semiconductor capacitor structure 12 further includes a step 128, removing portions of the second insulating layer and a portion of the supporting layers to form a plurality of second trenches. In the second embodiment, the plurality of second trenches expose the plurality of first insulating layers and the plurality of conductive layers. The method for preparing the semiconductor capacitor structure 12 further includes a step 129, removing the patterned hard mask. The method for preparing the semiconductor capacitor structure 12 further includes a step 130, removing the plurality of first insulating layers and the second insulating layer to form a plurality of comb-like bottom electrodes. The method for preparing the semiconductor capacitor structure 12 further includes a step 132, forming a dielectric layer to cover the plurality of comb-like bottom electrodes. The method for preparing the semiconductor capacitor structure 12 further includes a step 134, forming a plurality of top electrodes on the dielectric layer. The method for preparing the semiconductor capacitor structure 12 will be further described according to the first embodiment.

FIGS. 11A, 12A, 13A and 14A are schematic diagrams illustrating various fabrication stages constructed according to the method for preparing the semiconductor capacitor structure in accordance with the second embodiment of the present disclosure, and FIGS. 11B, 12B, 13B and 14B are cross-sectional views taken along line II-II' in FIGS. 11A, 12A, 13A and 14A, respectively. It should be understood that similar features in the first and second embodiments can include similar materials, and thus such details are omitted in the interest of brevity.

Figure 11B:
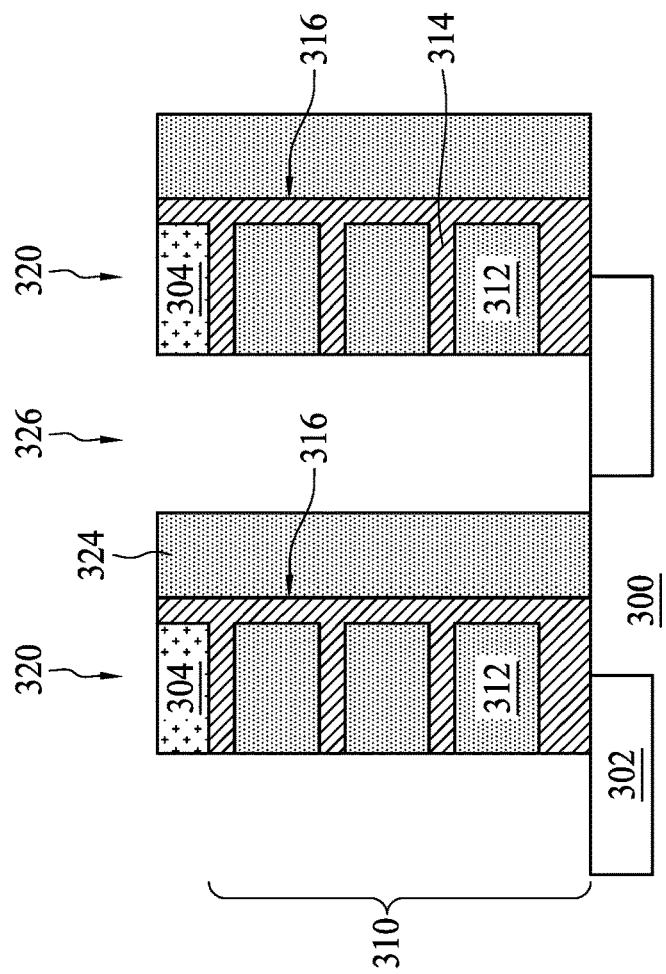
FIGS. 11B, 12B, 13B and 14B are cross-sectional views taken along line II-II' in FIGS. 11A, 12A, 13A and 14A, respectively.
Figure 11A:
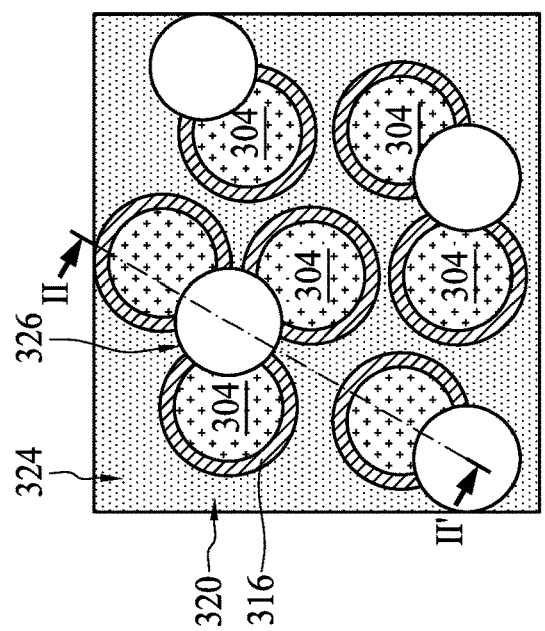
FIGS. 11A, 12A, 13A and 14A are schematic diagrams illustrating various fabrication stages of the method for preparing the semiconductor capacitor structure in accordance with the second embodiment of the present disclosure.

Referring to FIGS. 11A and 11B, a substrate 300 can be provided. A well region (not shown) may be formed in the substrate 300. The well region may be neutral, or may be an n-type or p-type doped region, depending on the conductivity type of the transistor structure formed thereafter. An isolation structure (not shown), such as an STI structure, is formed in the substrate 300 for defining at least an active region (not shown). At least a gate structure (not shown) is disposed in the substrate 300 in the active region. In some embodiments, the gate structure can be a buried gate structure, but the disclosure is not limited thereto. A first source/drain region (not shown) and a second source/drain region (not shown) are formed in the active region at two opposite sides of the gate structure. A bit line structure (not shown) can be formed over the first source/drain region. In some embodiments, the bit line structure and the first source/drain region are electrically connected by a contact plug (not shown). A landing pad 302 can be formed over the second source/drain region and electrically connected to the second source/drain region by a contact plug (not shown).

Still referring to FIGS. 11A and 11B, a multi-layer structure 310 is provided, according to step 120. In some embodiments, the multi-layer structure 310 is formed over the substrate 300. The multi-layer structure 310 includes a plurality of first insulating layers 312 and a plurality of conductive layers 314. In some embodiments, a patterned hard mask 304 can be formed on the multi-layer structure 310. As shown in FIG. 11B, the first insulating layers 312 and the conductive layers 314 are alternately arranged. The configuration of the multi-layer structure 310 can be similar as to the configuration of the multi-layer structure 210, therefore those details are omitted in the interest of brevity.

Still referring to FIGS. 11A and 11B, the multi-layer structure 310 is patterned to form a plurality of columns 320 over the substrate 300 through the patterned hard mask 304, according to step 122. As shown in FIGS. 11A and 11B, the plurality of columns 320 are separated from each other by a plurality of first trenches (not shown). In some embodiments, each of the plurality of columns 320 is formed on one of the landing pads 302. In some embodiments, each of the plurality of columns 320 partially overlaps one of the landing pads 302, as shown in FIG. 11B, but the disclosure is not limited thereto.

Still referring to FIGS. 11A and 11B, a conductive layer is formed over the substrate 300, and an etching back is performed to remove portions of the conductive layer. Consequently, a supporting layer 316 is formed on sidewalls of each of the plurality of columns 320, according to step 124. The supporting layer 316 includes materials that are the same as those included in the plurality of conductive layers 314. In some embodiments, a thickness of the supporting layer 316 can be the same as the thickness of the plurality of conductive layers 314, but the disclosure is not limited thereto. As shown in FIG. 11B, the supporting layer 316 is in contact with the plurality of conductive layers 314.

Still referring to FIGS. 11A and 11B, a second insulating layer 324 is formed to fill the plurality of first trenches according to step 126. In some embodiments, a planarization can be performed such that a top surface of the second insulating layer 324 is substantially coplanar with a top surface of the patterned hard mask 304.

Still referring to FIGS. 11A and 11B, portions of the second insulating layer 324 and a portion of the supporting layer 316 are removed to form a plurality of second trenches 326 on the substrate 300, according to step 128. In some embodiments, a portion of each of the plurality of columns 320 (i.e., the plurality of first insulating layers 312 and the plurality of conductive layers 314) is removed in step 128. In some embodiments, each of the plurality of second trenches 326 exposes the plurality of first insulating layers 312 and the plurality of conductive layers 314 of each column 320. Each second trench 326 is formed to be partially within at least one of the plurality of columns 310. As shown in FIG. 11A, the second trench 326 can be formed to be partially within one column 320, the second trench 326 can be formed to be partially within two columns 320, or the second trench 326 can be formed to be partially within three columns 320. In other embodiments, the second trench 326 can be formed to be partially within four or more columns 326, depending on the process or product requirements. Each of the columns 320 has a side exposed through one second trench 326, as shown in FIG. 11A. Specifically, the plurality of first insulating layers 312 and the plurality of conductive layers 314 are exposed through the second trench 326, as well as the second insulating layer 324. In other words, portions of sidewalls of each of the plurality of second trenches 326 are formed by the second insulating layer 324, and other portions of each of the plurality of second trenches 326 are formed by the plurality of conductive layers 314 and the plurality of first insulating layers 312.

Figure 12B:
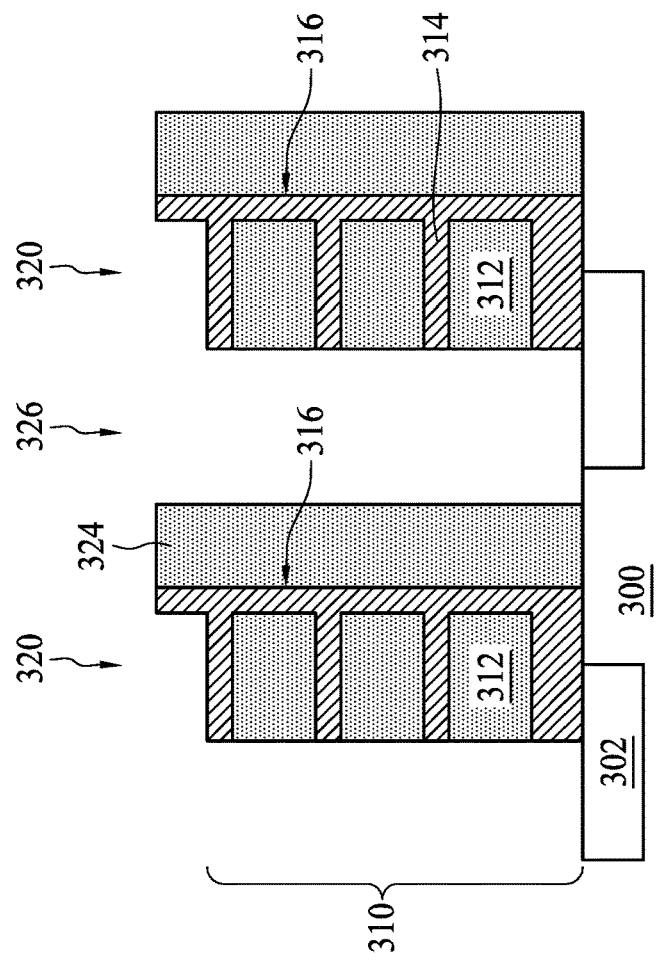
Figure 12A:
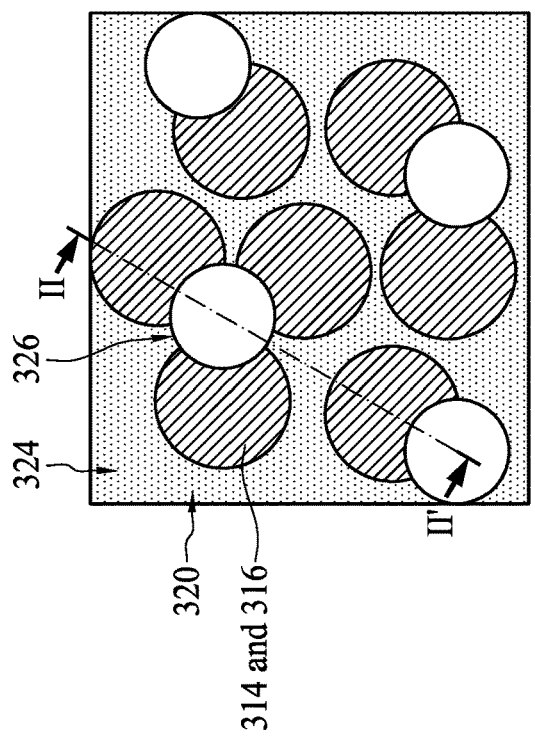

Referring to FIGS. 12A and 12B, the patterned hard mask 304 is removed according to step 129. In some embodiments, the patterned hard mask 304 causes each of the plurality of columns 320 to be a top-heavy structure. By removing the patterned hard mask 304, the weight distribution of each of the plurality of columns 320 is balanced, and thus toppling or leaning can be prevented.

Figure 13B:
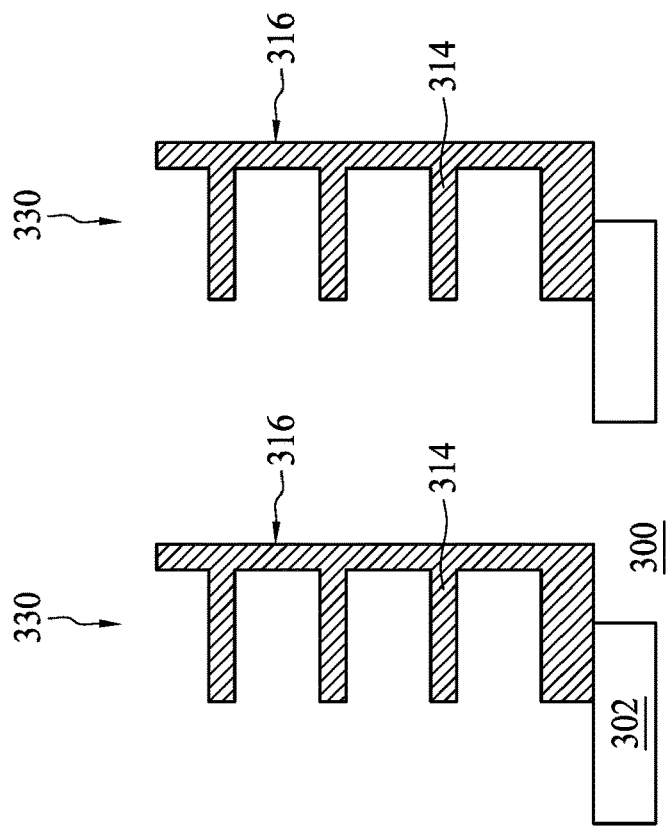
Figure 13A:
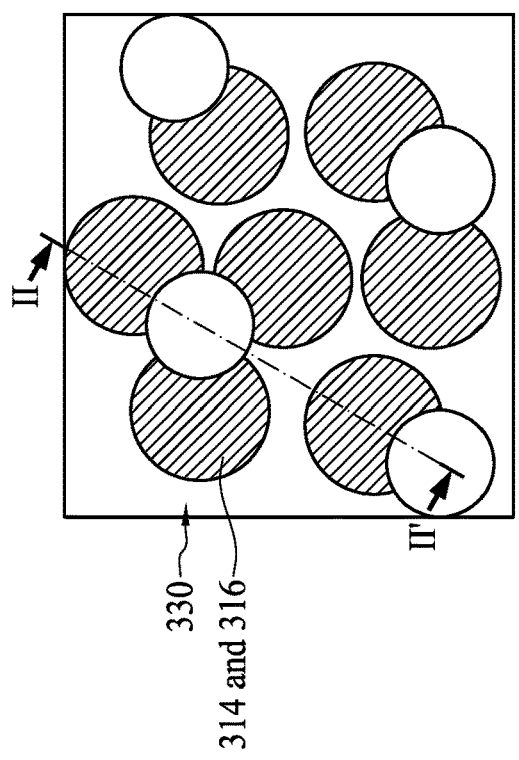

Referring to FIGS. 13A and 13B, the plurality of first insulating layers 312 and the second insulating layer 324 exposed through the second trenches 326 are entirely removed, and consequently a plurality of comb-like bottom electrodes 330 are formed, according to step 130. In other words, the plurality of columns 320 are transformed to be the plurality of comb-like bottom electrodes 330. As shown in FIG. 13B, each of the plurality of comb-like structures 330 includes the plurality conductive layers 314, and a portion of the supporting layer 316 coupled to the plurality of conductive layers 314.

Figure 14A:
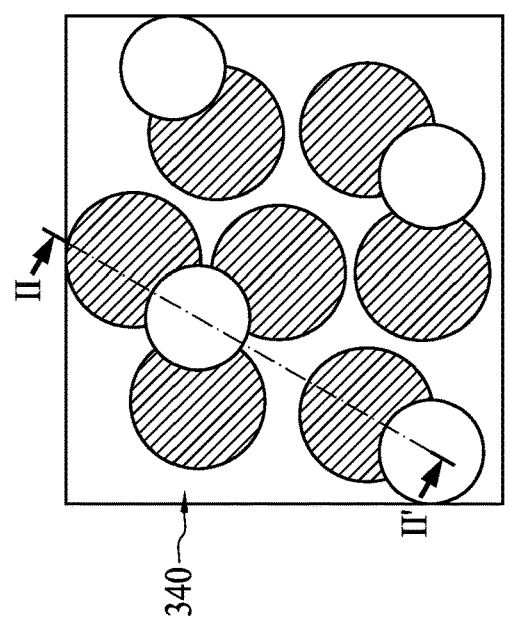
Figure 14B:
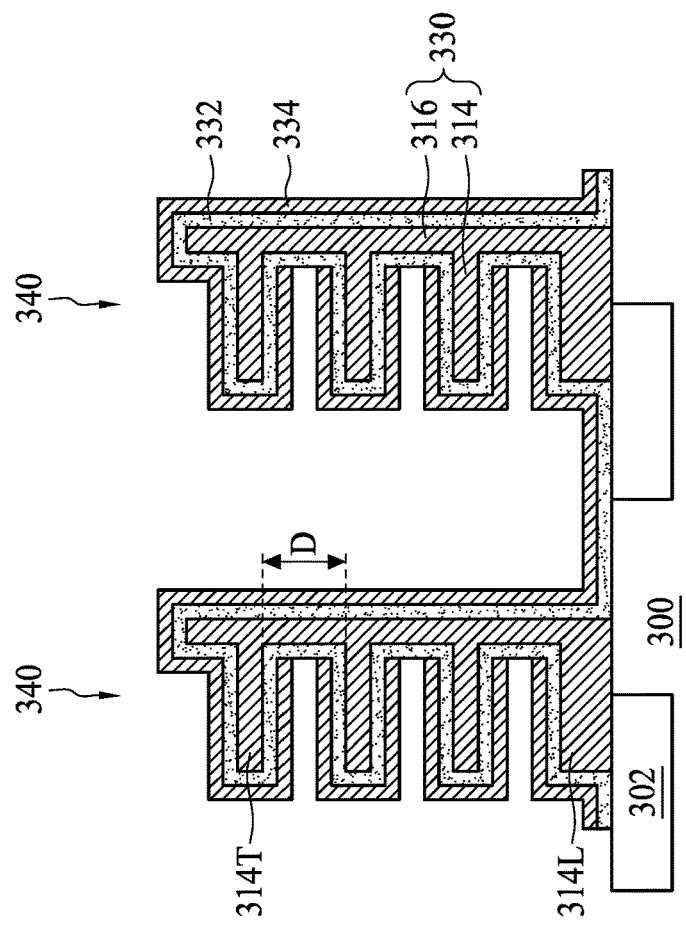

Referring to FIGS. 14A and 14B, a dielectric layer 332 is formed to cover the plurality of comb-like bottom electrodes 330 according to step 132. As shown in FIG. 14B, the dielectric layer 232 covers exposed surfaces of the plurality of conductive layers 314 and the supporting layer 316 of each comb-like bottom electrode 330. In other words, the dielectric layer 332 is entirely in contact with a surface of each of the plurality of the comb-like bottom electrodes 330, as shown in FIG. 14B. Additionally, in some embodiments, the dielectric layer 332 covers the landing pads 302.

Still referring to FIGS. 14A and 14B, a plurality of top electrodes 334 are formed on the dielectric layer 332 according to step 134. Each of the plurality of top electrodes 334 is separated from each of the plurality of comb-like bottom electrodes 330 by the dielectric layer 332.

Accordingly, a semiconductor capacitor structure 340 is provided. As shown in FIGS. 14A and 14B, the semiconductor capacitor structure 340 includes the substrate 300, the comb-like bottom electrode 330 disposed over the substrate 300, the top electrode 334 disposed over the comb-like bottom electrode 330, and the dielectric layer 332 sandwiched between the top electrode 334 and the comb-like bottom electrode 330. As shown in FIG. 14B, the comb-like bottom electrode 330 includes a plurality of tooth portions 314, which are formed by the plurality of conductive layers 314, and a supporting portion 316, which is formed by the supporting layer 316. As shown in FIG. 14B, the plurality of tooth portions 314 extend along a direction parallel to a surface of the substrate 300, while the supporting portion 316 extends along a direction perpendicular to the surface of the substrate 300. In other words, the plurality of tooth portions 314 are parallel to the substrate 300 while the supporting portion 316 is perpendicular to the substrate 300.

Each of the tooth portions 314 of the comb-like bottom electrode 330 is separated from other tooth portions 314 by a distance D. In some embodiments, the distances D between adjacent pairs of tooth portions 314 are the same, but the disclosure is not limited thereto. In some embodiments, the plurality of tooth portions 314 includes a topmost tooth 314T, and the dielectric layer 332 is in contact with the top surface of the topmost tooth 314T. In some embodiments, the plurality of tooth portions 314 includes a lowest tooth 314L, and a thickness of the lowest tooth 314L is greater than a thickness of the other tooth portions 314, but the disclosure is not limited thereto. In some embodiments, the comb-like bottom electrode 330 is disposed on a landing pad 302, and the lowest tooth 314L is electrically connected to the landing pad 302, which is electrically connected to the second source/drain region of the transistor device of the DRAM cell. In some embodiments, the landing pad 302 and the comb-like bottom electrode 330 can include different materials. In alternative embodiments, the landing pad 302 and the comb-like bottom electrode 330 can include the same materials. In some embodiments, the lowest tooth 314L can serve as a landing pad, which is electrically connected to the second source/drain region of the transistor device of the DRAM cell.

Still referring to FIGS. 14A and 14B, capacitance is a function only of the geometry of the design (e.g. surface area of the electrodes 330 and 334, and the distance between them) and the permittivity of the dielectric layer 332 between the electrodes 330 and 334 of the semiconductor capacitor structure 340. The comb-like configuration of the bottom electrode 330 helps to increase surface area of the two electrodes 330 and 334. The capacitance of the semiconductor capacitor structure 340 provided by the present disclosure is therefore increased due to the comb-like configuration.

In the present disclosure, the comb-like bottom electrodes 230 and 330 are provided. It is well known that capacitance is a function only of the geometry of the design (e.g. surface area of the electrodes and the distance between them) and the permittivity of the dielectric material between the electrodes of the capacitor. The comb-like configuration increases surface area of the electrodes. The capacitance of the semiconductor capacitor structures 240 and 340 provided by the present disclosure is therefore increased without increasing area occupied by the capacitor structure due to the comb-like configuration.

In contrast, with a comparative method applied without forming the comb-like bottom electrode, complicated photolithography and etching processes are required to form a thinner and taller electrode in order to increase the surface area. Further, it is observed that such thin, tall bottom electrode, may collapse. Accordingly, not only are the conventional processes for forming a DRAM cell structure complicated, but such process also provides reduced yield and reliability.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing a semiconductor capacitor structure, comprising:
   providing a multi-layer structure comprising a plurality of first insulating layers and a plurality of conductive layers, wherein the first insulating layers and the conductive layers are alternately arranged;
   patterning the multi-layer structure to form a plurality of columns, wherein the plurality of columns are separated from each other by a plurality of first trenches;
   forming a supporting layer on sidewalls of each of the plurality of columns;
   filling the plurality of first trenches with a second insulating layer;
   removing portions of the second insulating layer and a portion of the supporting layer to form a plurality of second trenches exposing the plurality of first insulating layers and the plurality of conductive layers;
   removing the plurality of first insulating layers and the second insulating layer to form a plurality of comb-like bottom electrode;
   forming a dielectric layer to cover the plurality of comb-like bottom electrodes; and
   forming a plurality of top electrodes on the dielectric layer.

2. The method of claim 1, wherein two of the plurality of conductive layers form a top and a bottom of the multi-layer structure.

3. The method of claim 1, wherein a thickness of the plurality of first insulating layers is greater than a thickness of the plurality of conductive layers.

4. The method of claim 1, wherein a width of the plurality of columns is between approximately 5 nm and approximately 200 nm.

5. The method of claim 1, wherein portions of sidewalls of each of the plurality of second trenches are formed by the second insulating layer, and other portions of each of the plurality of second trenches are formed by the plurality of conductive layers and the plurality of first insulating layers.

6. The method of claim 1, wherein each of the plurality of comb-like structures comprises the plurality of conductive layers and a portion of the supporting layer coupled to the plurality of conductive layers.

7. The method of claim 1, wherein a width of the plurality of first trenches is between approximately 5 nm and approximately 200 nm.

8. The method of claim 7, wherein a width of the plurality of second trenches is less than the width of the plurality of first trenches.

9. The method of claim 1, wherein the forming of the plurality of columns further comprises:
   forming a patterned hard mask on the multi-layer structure; and
   removing portions of the multi-layer structure through the patterned hard mask.

10. The method of claim 9, wherein the dielectric layer covers a top surface of the patterned hard mask.

11. The method of claim 9, wherein the patterned hard mask is removed after the forming of the plurality of second trenches.

* * * * *